(12) United States Patent
Kunihiro

(10) Patent No.: US 6,992,499 B2
(45) Date of Patent: Jan. 31, 2006

(54) TEST METHOD AND TEST APPARATUS FOR SEMICONDUCTOR DEVICE

(75) Inventor: Takashi Kunihiro, Kitakyushu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/859,189

(22) Filed: Jun. 3, 2004

(65) Prior Publication Data

US 2005/0009218 A1 Jan. 13, 2005

(30) Foreign Application Priority Data

Jun. 4, 2003 (JP) ............................. 2003-159576

(51) Int. Cl.
*G01R 31/26* (2006.01)
(52) U.S. Cl. ..................................... 324/765
(58) Field of Classification Search ................ 324/763, 324/765, 158.1, 760; 438/14, 17, 18
See application file for complete search history.

(56) References Cited

U.S. PATENT DOCUMENTS 5,793,650 A * 8/1998 Mirza ......................... 702/34
6,259,267 B1 * 7/2001 Fujiwara ..................... 324/765
6,553,323 B1   4/2003 Obara et al.
6,657,453 B2 * 12/2003 Frankowsky ................ 324/765

FOREIGN PATENT DOCUMENTS

| JP | 10-313026 | 11/1998 |
|---|---|---|
| JP | 2001-318151 | 11/2001 |
| JP | 2002-26102 | 1/2002 |
| WO | WO 98/33213 | 7/1998 |

* cited by examiner

*Primary Examiner*—Vinh Nguyen
*Assistant Examiner*—Tung X. Nguyen
(74) *Attorney, Agent, or Firm*—Oblon, Spivak, McClelland, Maier & Neustadt, P.C.

(57) ABSTRACT

A method for testing a semiconductor device, is disclosed, which comprises detecting a defect in a semiconductor wafer having a plurality of chips on each of which a plurality of semiconductor elements are formed, to detect those of the chips which have a defect, and carrying out a fist electrical characteristics test to a first chip without defect, and a second electrical characteristics test which is more detailed than the first electrical characteristics test to a second chip having the defect.

18 Claims, 4 Drawing Sheets

TEST METHOD AND TEST APPARATUS FOR SEMICONDUCTOR DEVICE

CROSS-REFERENCE TO RELATED APPLICATIONS

This application is based upon and claims the benefit of priority from prior Japanese Patent Application No. 2003-159576, filed Jun. 4, 2003, the entire contents of which are incorporated herein by reference.

BACKGROUND OF THE INVENTION

1. Field of the Invention

The present invention relates to a test method and a test apparatus for a semiconductor device for use in a process of manufacturing the semiconductor device.

2. Description of the Related Art

In a process of manufacturing a semiconductor device, due to tests being carried out with respect to the semiconductor device, the characteristics/reliability of the semiconductor device are ensured. FIG. 2 shows the flow of the process of manufacturing a semiconductor device. As shown in FIG. 2, tests are carried out during the manufacturing process. These tests can be broadly divided into a visual defect detection for a semiconductor device in a process of forming a large number of semiconductor devices at respective chip regions on a semiconductor wafer, an electrical characteristics test for a semiconductor device formed by packaging the chips which are sectioned out of the semiconductor wafer and on which the large number of semiconductor devices are formed, and a reliability test which is carried out finally.

The visual defect detection is composed of a wafer visual detection, a dust detection, a crystal defect detection, and the like, and is usually carried out about five times with respect to a wafer on which a pattern is formed by, for example, photo etching process (PEP). A problem in appearance such as an abnormality in processing of a pattern, or the like, the presence of dust, defects such as a crystal defect or the like are detected by a defect detection unit. When there is an abnormality (for example, a given number or more of defects arise, or the like) in the detected data, it is dealt with it by a countermeasure in which the products are diced and thrown away in wafer units or lot units, or the presence of an abnormality in a manufacturing apparatus is inspected and restored.

The electrical characteristics test is an test which is carried out with respect to the chips having a large number of semiconductor devices formed thereon and a semiconductor device formed by packaging the chips, and the presence of an operating abnormality in the respective elements is detected by inspecting the operations of the respective elements while varying various electrical parameters. Only the semiconductor devices which are determined to be non-defective products here are provided to the next process.

Moreover, the reliability test is for detecting the presence of an operating abnormality in the respective devices by inspecting the operations of the respective devices while varying various reliability parameters, and for detecting the presence of an abnormality in appearance of the respective devices, with respect to the packaged semiconductor devices. Then, only the semiconductor devices which are determined to be non-defective products here are shipped to market.

In this way, a determination on the non-defect/defect is carried out for each semiconductor device by the electrical characteristics test and the reliability test. However, as the relationship between the test rate and the test time of the electrical characteristics test is shown in FIG. 15, because the test time materially increases when an test rate of the semiconductor device is over 95% with respect to each semiconductor device, as a practical matter, the tests are carried out with respect to about 95% of the semiconductor devices. Therefore, there has been some possibility in which semiconductor devices including semiconductor devices having an abnormality among 5% of the semiconductor devices which are not inspected are shipped, and market defective accidents arise. Further, in the case of a bipolar IC or the like, there has been the problem that an operating abnormality arises only in cases of restricted test parameters (input current, voltage, frequency, temperature, and the like).

Various methods for efficiently carrying out tests at a high accuracy have been studied before now. For example, there have been proposed a method in which an attempt is made to make a foreign matter detection efficient as in Jpn. Pat. Appln. KOKAI Publication No. 10-313026, and a method in which an attempt is made to improve a testing efficiency by using low quality information on a wafer and a mask as in Jpn. Pat. Appln. KOKAI Publication 2001-318151. However, these do no more than improve an test efficiency, and do not reflect the evaluations thereof to evaluations as non-defective product chips, and do not suppress the outflow of defective product chips.

BRIEF SUMMARY OF THE INVENTION

According to an aspect of the present invention, there is provided a method for testing a semiconductor device, comprising:

detecting a defect in a semiconductor wafer having a plurality of chips on each of which a plurality of semiconductor elements are formed, to detect those of the chips which have a defect; and carrying out a fist electrical characteristics test to a first chip without defect, and a second electrical characteristics test which is more detailed than the first electrical characteristics test to a second chip having the defect.

According to another aspect of the present invention, there is provided a test apparatus for use in a process of manufacturing a semiconductor device, comprising:

a detector configured to detect a defect in a semiconductor wafer having a plurality of chips on each of which a plurality of semiconductor elements are formed, to detect those of the chips which have a defect; and a test unit configured to carry out a fist electrical characteristics test to a first chip without defect, and a second electrical characteristics test which is more detailed than the first electrical characteristics test to a second chip having the defect.

DETAILED DESCRIPTION OF THE INVENTION

Hereinafter, embodiments of the present invention will be described with reference to the accompanying drawings.

(First Embodiment)

Figure 1:
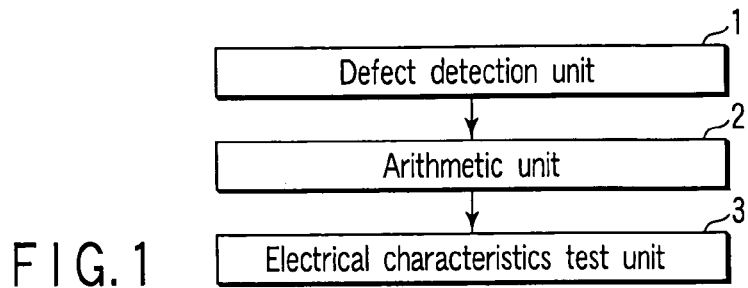
FIG. 1 is a diagram illustrating a configuration of a test apparatus of a semiconductor device, which is a first embodiment of the present invention.

A configuration of a test apparatus of a semiconductor device of the present embodiment is shown in FIG. 1. As shown in FIG. 1, the test apparatus is configured of a defect detection unit 1, an arithmetic processing unit 2, and an electrical characteristics test unit 3.

Figure 2:
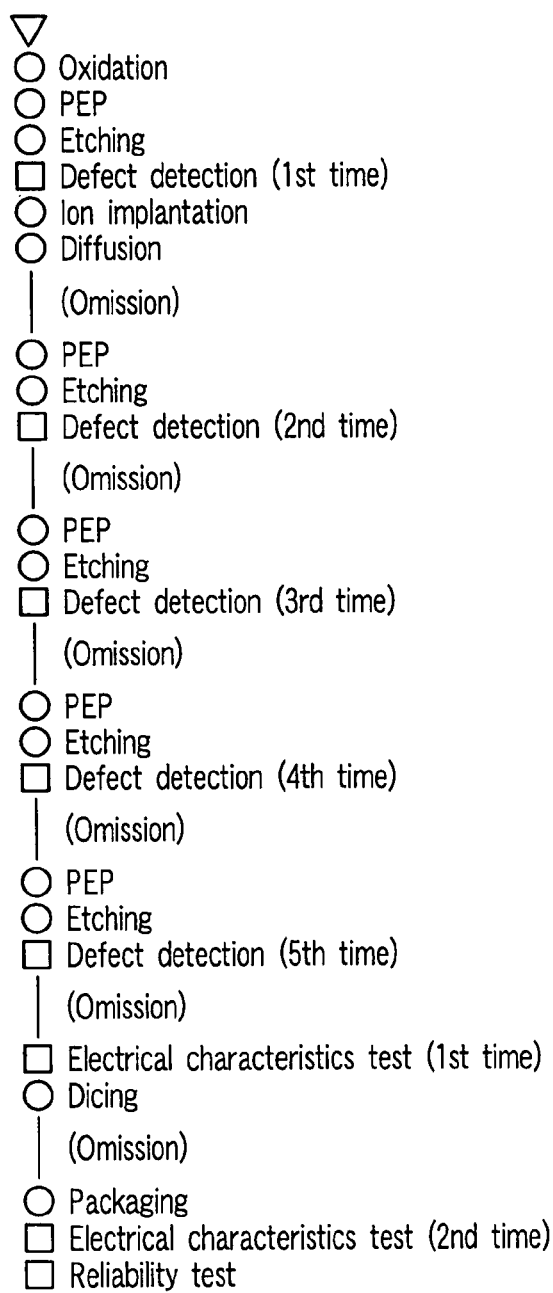
FIG. 2 is a diagram showing a flow of a process of manufacturing a semiconductor device.

First, according to a general process of manufacturing a semiconductor device shown in FIG. 2, five defective detections are carried out by using the defect detection unit 1. Here, the defects are classified in accordance with the contents thereof, and the presence of defects and the number of defects are detected for each classified defect. Those are, for example, the presence of defects and the total number of the defects, the presence of critical defects (considerable defects in a shape and a size) and the number of the defects, the presence of singular defects (a defect in a predetermined appearance and size) and the number of the defects, the presence of combined defects and the number of the defects, and the like, and those are automatically detected as the data (information) for each chip.

Figure 3:
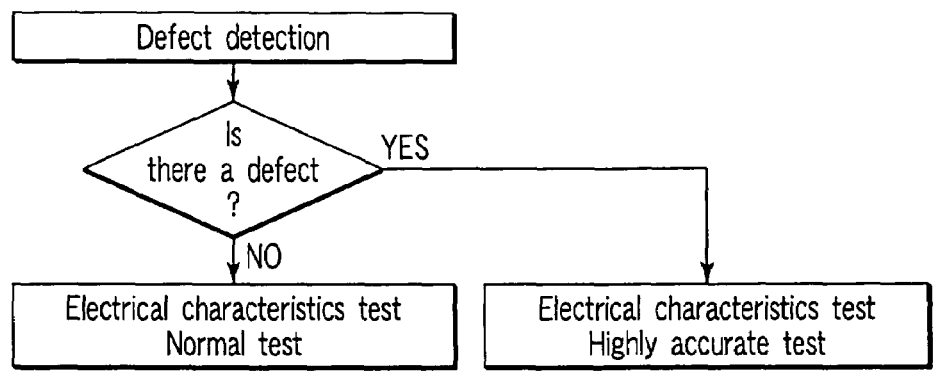
FIG. 3 is a diagram showing a flowchart of a process of test according to the first embodiment of the present invention.
Figure 4:
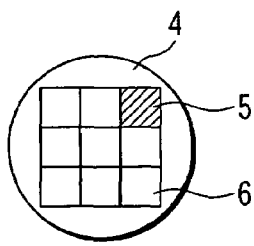
FIG. 4 is a diagram showing an example of the result of the defect detection for chips of a semiconductor wafer in the first embodiment of the present invention.
Figure 5:
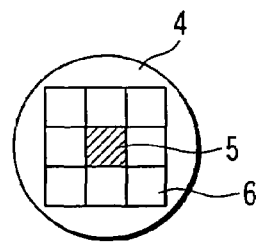
FIG. 5 is a diagram showing an example of the result of the defect detection for the chips of the semiconductor wafer in the first embodiment of the present invention.
Figure 6:
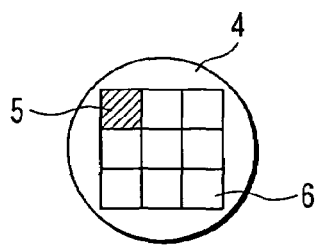
FIG. 6 is a diagram showing an example of the result of the defect detection for the chips of the semiconductor wafer in the first embodiment of the present invention.
Figure 7:
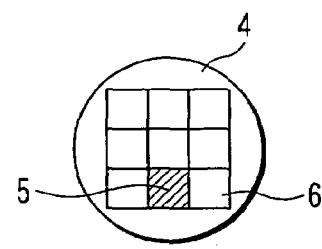
FIG. 7 is a diagram showing an example of the result of the defective test for the chips of the semiconductor wafer in the first embodiment of the present invention.
Figure 8:
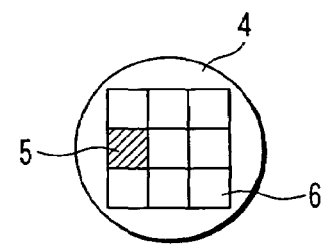
FIG. 8 is a diagram showing an example of the result of the defective test for the chips of the semiconductor wafer in the first embodiment of the present invention.

The data of the respective defect detections for each chip of a semiconductor wafer are fed back to a manufacturing apparatus (not shown). Also, the data of the defect detections are transmitted to the arithmetic processing unit 2 and arithmetically processed by the arithmetic processing unit 2, and transmitted to the electrical characteristics test unit 3. Then, on the basis of the transmitted data of the chips, a first electrical characteristics test is carried out by the electrical characteristics test unit 3. In this case, as shown in a flowchart of FIG. 3, with respect to the chips in which defects arose in any of the first to fifth defect detections, the electrical characteristics test is carried out with respect to all of the semiconductor devices in the chips as high-risk chips. On the other hand, with respect to the chips in which no defect has been recognized in any defect detection, the electrical characteristics test is carried out with respect to 95% of the semiconductor devices.

Figure 9:
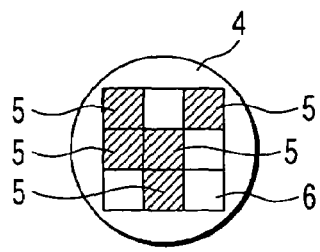
FIG. 9 is a diagram showing the results of the defective tests for the chips of the semiconductor wafer in the first embodiment of the present invention.
Figure 10:
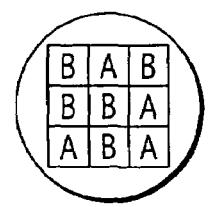
FIG. 10 is a diagram showing conditions A (normal test) and B (highly accurate test) applied for the chips of the semiconductor wafer in the first embodiment of the present invention.

For example, examples of the first, second, third, fourth and fifth defect detections are shown in FIG. 4 to FIG. 8. Chip 5 of a wafer 4 has a defect, and a chip 6 has no defect, and the results of the defect and non-defect are processed by arithmetic processing unit 2, which result is as shown in FIG. 9. On the basis of the result, the electrical characteristics tests are carried out to the chips under condition A (normal test) or condition B (highly accurate test), as shown in FIG. 10.

Further, a determination on a non-defective product or a defective product is carried out for each chip, circles are marked on the defective products in ink, the wafer is diced to separate the products, and only the non-defective products which have not been marked are packaged. The packaged semiconductor devices are managed by number (No.) information. Next, a second electrical characteristics test which is more than detailed than the first electrical characteristics test is carried out with respect to the packaged semiconductor devices, and thereafter, only the non-defective products are shipped.

The number of the defect detections is not limited to five times, and is different in accordance with the manufacturing process, there are cases in which the number of defect detections may be less than five, or more than five defect detections may be required.

(Second Embodiment)

Figure 11:
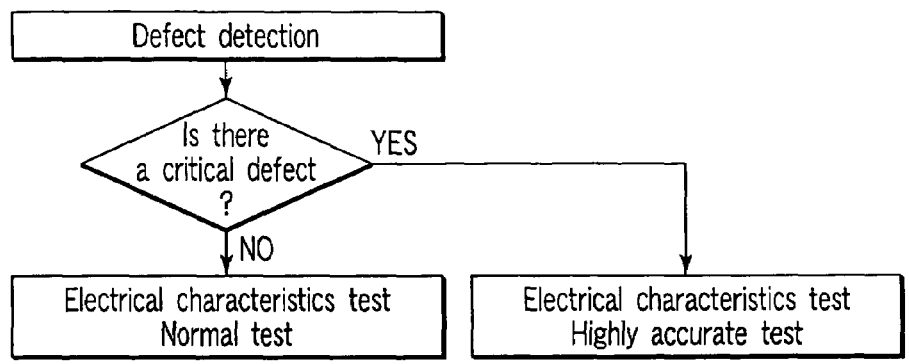
FIG. 11 is a diagram showing a flowchart of a process of test according to a second embodiment of the present invention.

Like the first embodiment, the data of the five defect detections for each chip are fed back to a manufacturing apparatus. Also, the data of the defect detections are transmitted to the arithmetic processing unit 2 and arithmetically processed by the arithmetic processing unit 2, and transmitted to the electrical characteristics test unit 3. Then, on the basis of the transmitted data of the chips, the first electrical characteristics test is carried out by the electrical characteristics test unit 3. In this case, as shown in a flowchart of FIG. 11, with respect to the chips in which critical defects arose in any of the first to fifth defect detections, the electrical characteristics test is carried out with respect to all of the semiconductor devices in the chips as high-risk chips. On the other hand, with respect to the chips in which no defect has been recognized in any defect detection, the electrical characteristics test is carried out with respect to 95% of the semiconductor devices.

After that, like the first embodiment, a determination on a non-defective product or a defective product is carried out for each chip, circles are marked on the defective products in ink, the semiconductor wafer is diced to separate the products, and only the non-defective products which have not been marked are packaged. Then, the second electrical characteristics test is carried out with respect to the packaged semiconductor devices, and thereafter, only the non-defective products are shipped.

As in the first embodiment, the number of the defect detections is not limited to five times, and is changed in accordance with the manufacturing process, there are cases in which the number of defect detections may be less than five, or more than five defect detections may be required.

(Third Embodiment)

Figure 12:
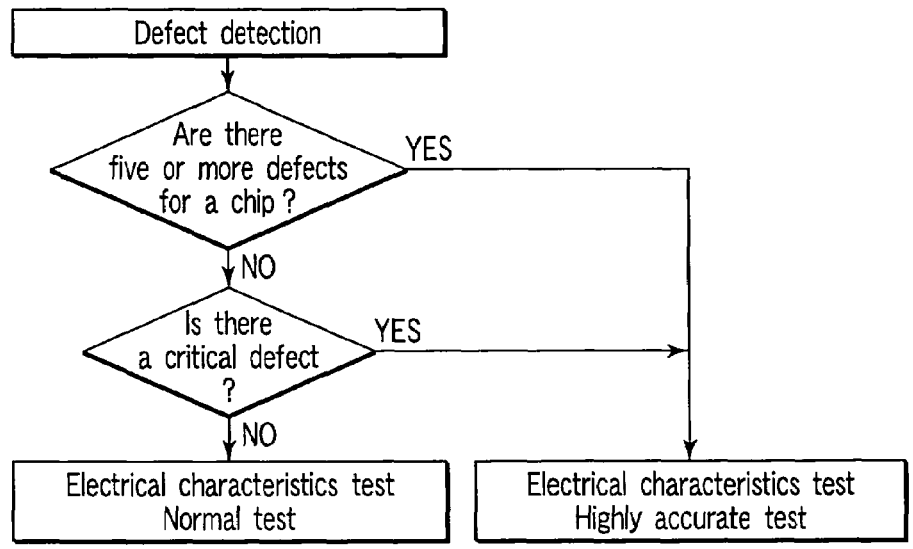
FIG. 12 is a diagram showing a flowchart of a process of test according to a third embodiment of the present invention.

Like the first and second embodiments, the data of the five defect detections for each chip are fed back to a manufacturing apparatus. Also, the data of the defect detections are transmitted to the arithmetic processing unit 2 and arithmetically processed by the arithmetic processing unit 2, and transmitted to the electrical characteristics test unit 3. Then, on the basis of the transmitted data of the chips, the first electrical characteristics test is carried out by the electrical characteristics test unit 3. In this case, as shown in a flowchart of FIG. 12, with respect to the chips in which five or more defects or one or more critical defects arose in any of the first to fifth defect detections, a highly accurate electrical characteristics test is carried out as the high-risk chips, with the patterns in the test parameters (input voltage, electric current, frequency, temperature, and the like) being increased (for example, in the case of a temperature, with two patterns of an ordinary temperature and a high temperature). On the other hand, with respect to the other chips, the electrical characteristics test is carried out with the normal patterns (for example, in a case of a temperature, only an ordinary temperature).

After that, like the first and second embodiments, a determination on a non-defective product or a defective product is carried out for each chip, circles are marked on the defective products in ink, the semiconductor wafer is diced to separate the products, and only the non-defective products which have not been marked are packaged. Then, the second electrical characteristics test is carried out with respect to the packaged semiconductor devices, and thereafter, only the non-defective products are shipped.

As in the first and second embodiments, the number of the defect detections is not limited to five times, and is changed in accordance with the manufacturing process, there are cases in which the number of defect detections may be less than five, or more than five defect detections may be required.

(Fourth Embodiment)

Figure 13:
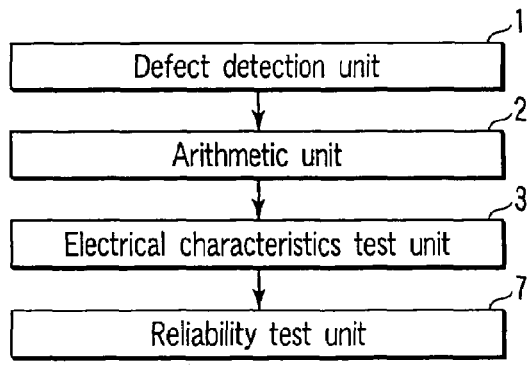
FIG. 13 is a diagram illustrating a configuration of an test apparatus of a semiconductor device, which is a fourth embodiment of the present invention.

A configuration of a test apparatus of a semiconductor device according to a fourth embodiment of the present embodiment is shown in FIG. 13. As shown in FIG. 13, the test apparatus is configured of the defect detection unit 1, the arithmetic processing unit 2, the electrical characteristics test unit 3, and a reliability test unit 7.

Figure 14:
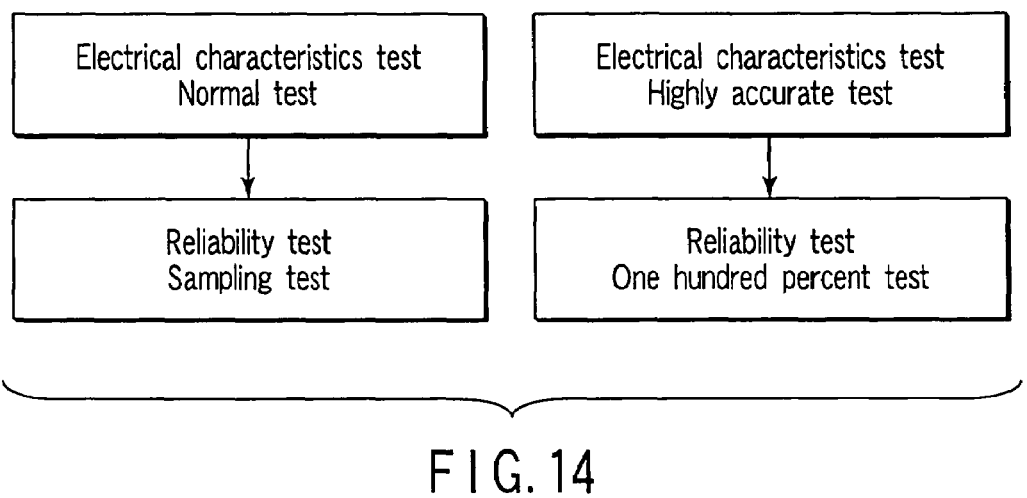
FIG. 14 is a diagram showing a flowchart of a process of test according to the fourth embodiment of the present invention.
Figure 15:
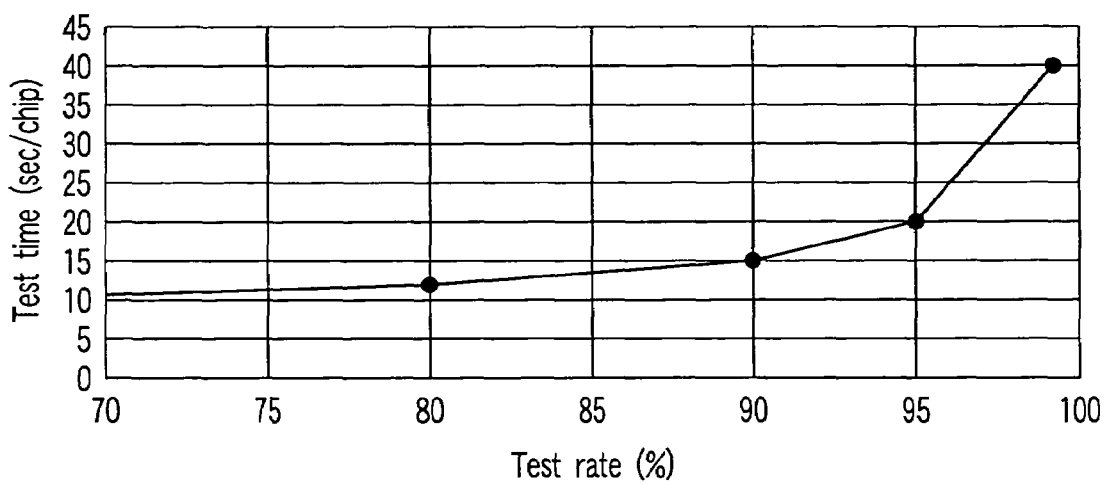
FIG. 15 is a graph showing the relationship between the test rate and the test time of a conventional electrical characteristics test.

In the same manner as in the first, second and third embodiments, five defect detections and two electrical characteristics tests are carried out. A reliability test is carried out with respect to the chips determined to be non-defective products in the two electrical characteristics tests. The information of the chips from the arithmetic processing unit 2 are transmitted to the reliability test unit 7 as well. On the basis of the information, as shown in FIG. 14 showing the flow after the electrical characteristics test, the reliability test is carried out in a sampling manner with respect to the chips on which the normal test of the electrical characteristics test is carried out. On the other hand, also as shown in FIG. 14, the reliability test is carried out with respect to all of the high-risk chips on which a highly accurate test (total test/all item test) of the electrical characteristics test is carried out.

In the present embodiment as well, the number of times of the defect detections is not limited to five, and is changed in accordance with the manufacturing process. There are cases in which the number of defect detections may be less than five, or more than five defect detections may be required.

As described above, in the above-described respective embodiments, chips which are determined that there is the problem on the items, which are previously set, for the defect detection are sampled as high-risk chips, and the highly accurate electrical characteristics test and reliability test are carried out with respect to only the high-risk chips. In accordance therewith, highly accurate tests can be efficiently carried out with respect to a large number of chips, and it is possible to suppress an occurrence of a market defect accident after shipping the products. In this way, in accordance with the respective embodiments, an inspecting method and an test apparatus for a semiconductor device in which it is possible to more efficiently and even highly accurately suppress the outflow of defective products can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A method for testing a semiconductor device, comprising:

detecting a defect in a semiconductor wafer having a plurality of chips on each of which a plurality of semiconductor elements are formed, and detecting chips which have the defect; and carrying out a first electrical characteristics test to a first chip without the defect, and a second electrical characteristics test, which is more detailed than the first electrical characteristics test, to a second chip having the defect, wherein the second electrical characteristics test has more test parameters than the first electrical characteristics test.

2. A method according to claim 1, wherein the first electrical characteristics test is carried out to a predetermined ratio of the semiconductor elements in the first chip, and the second electrical characteristics test is carried out to all the elements in the second chip.

3. A method according to claim 2, wherein the predetermined ratio is 95%.

4. A method according to claim 1, wherein the defect detection is carried out two or more times in accordance with a semiconductor manufacturing process.

5. A method according to claim 4, wherein the second electrical characteristics test is carried out to a chip in which the defect is detected in any of the detections.

6. A method according to claim 4, wherein the first electrical characteristics test is carried out to a chip in which the defect is not detected in any of the detections.

7. A method according to claim 1, wherein the defect detection is carried out two or more times in accordance with a semiconductor manufacturing process.

8. A method according to claim 7, wherein the second electrical characteristics test is carried out to a chip in which the defect is detected in any of the detections.

9. A method according to claim 7, wherein the first electrical characteristics test is carried out to a chip in which the defect is not detected in any of the detections.

10. A test apparatus for use in a process of manufacturing a semiconductor device, comprising:
   a detector configured to detect a defect in a semiconductor wafer having a plurality of chips on each of which a plurality of semiconductor elements are formed, and to detect chips which have the defect; and
   a test unit configured to carry out a first electrical characteristics test to a first chip without the defect, and a second electrical characteristics test, which is more detailed than the first electrical characteristics test, to a second chip having the defect, wherein the second electrical characteristics test has more test parameters than the first electrical characteristics test.

11. A test apparatus according to claim 10, wherein the first electrical characteristics test is carried out to a predetermined ratio of the semiconductor elements in the first chip, and the second electrical characteristics test is carried out to all the elements in the second chip.

12. A test apparatus according to claim 11, wherein the predetermined ratio is 95%.

13. A test apparatus according to claim 11, wherein the defect detection is carried out two or more times in accordance with a semiconductor manufacturing process.

14. A test apparatus according to claim 13, wherein the second electrical characteristics test is carried out to a chip in which the defect is detected in any of the detections.

15. A test apparatus according to claim 13, wherein the first electrical characteristics test is carried out to a chip in which the defect is not detected in any of the detections.

16. A test apparatus according to claim 10, wherein the defect detection is carried out two or more times in accordance with a semiconductor manufacturing process.

17. A test apparatus according to claim 16, wherein the second electrical characteristics test is carried out to a chip in which the defect is detected in any of the detections.

18. A test apparatus according to claim 16, wherein the first electrical characteristics test is carried out to a chip in which the defect is not detected in any of the detections.

* * * * *